United States Patent [19]
Chang et al.

[11] Patent Number: 5,627,788
[45] Date of Patent: May 6, 1997

[54] MEMORY UNIT WITH BIT LINE DISCHARGER

[75] Inventors: Vincent W. Chang, Gold River; Haluk Katircioglu, Fair Oaks; Harsh Kumar, El Dorado Hills; Nihar Mohapatra, Folsom, all of Calif.

[73] Assignee: Intel Corporation, Santa Clara, Calif.

[21] Appl. No.: 437,090

[22] Filed: May 5, 1995

[51] Int. Cl.$^6$ ........................................ G11C 7/00
[52] U.S. Cl. .................... 365/204; 365/236; 365/227
[58] Field of Search ............................. 365/204, 154, 365/236, 233, 227

[56] References Cited

U.S. PATENT DOCUMENTS 5,200,924  4/1993  Wong ........................................ 365/204
5,416,742  5/1995  Takada ...................................... 365/203
5,473,572  12/1995 Margeson, III ........................... 365/227
5,502,679  3/1996  Hamamoto ........................... 365/182.25

*Primary Examiner*—David C. Nelms
*Assistant Examiner*—F. Niranjan
*Attorney, Agent, or Firm*—Blakely, Sokoloff, Taylor & Zafman

[57] ABSTRACT

An apparatus and method for managing a memory is disclosed. A discharging unit discharges overcharged bit lines in memory. The discharging unit discharges the bit lines after a predetermined time after the last memory access. The discharging unit also discharges the bit lines after a microprocessor comes out of a low power mode.

11 Claims, 6 Drawing Sheets

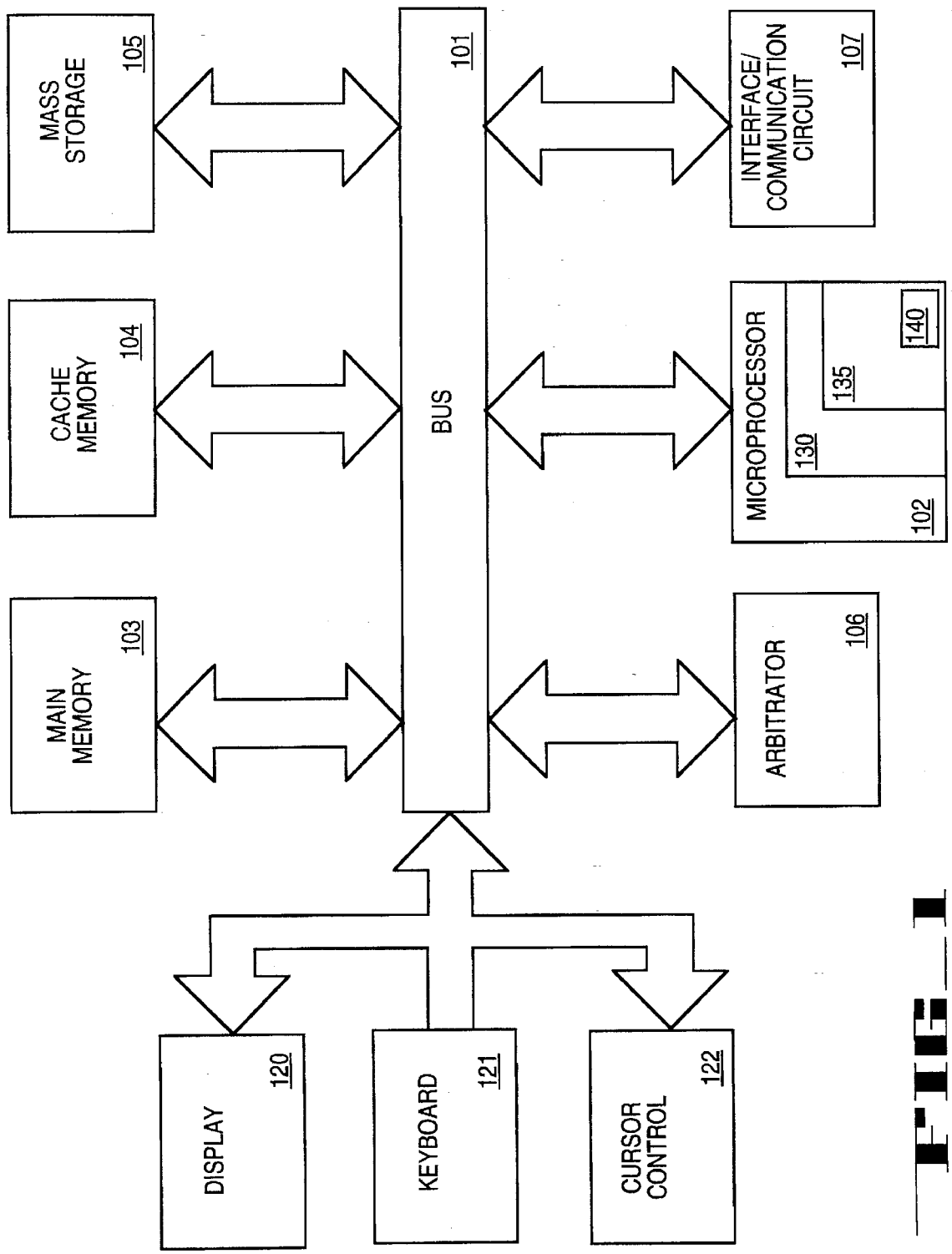
FIG_1

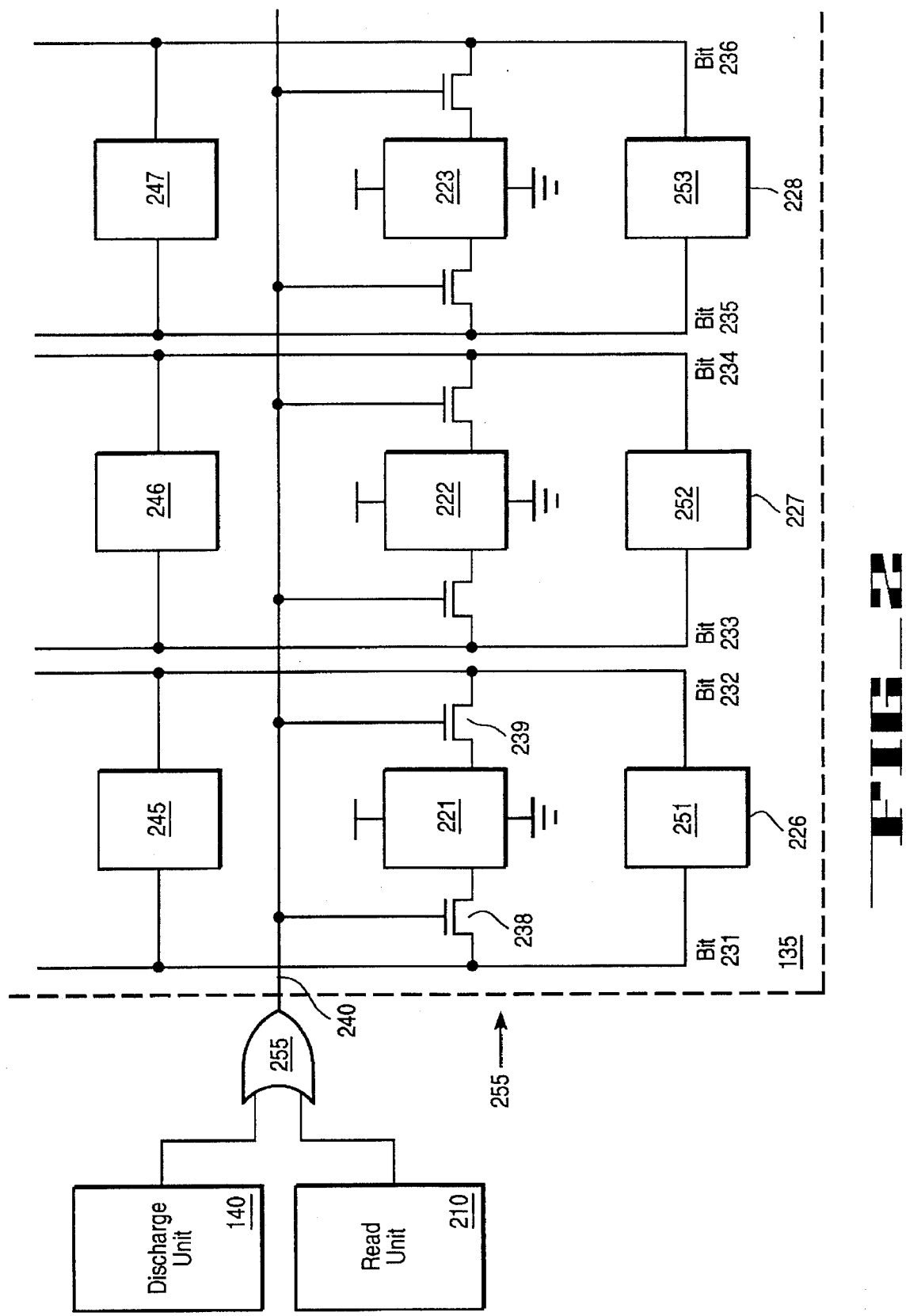
FIG._2

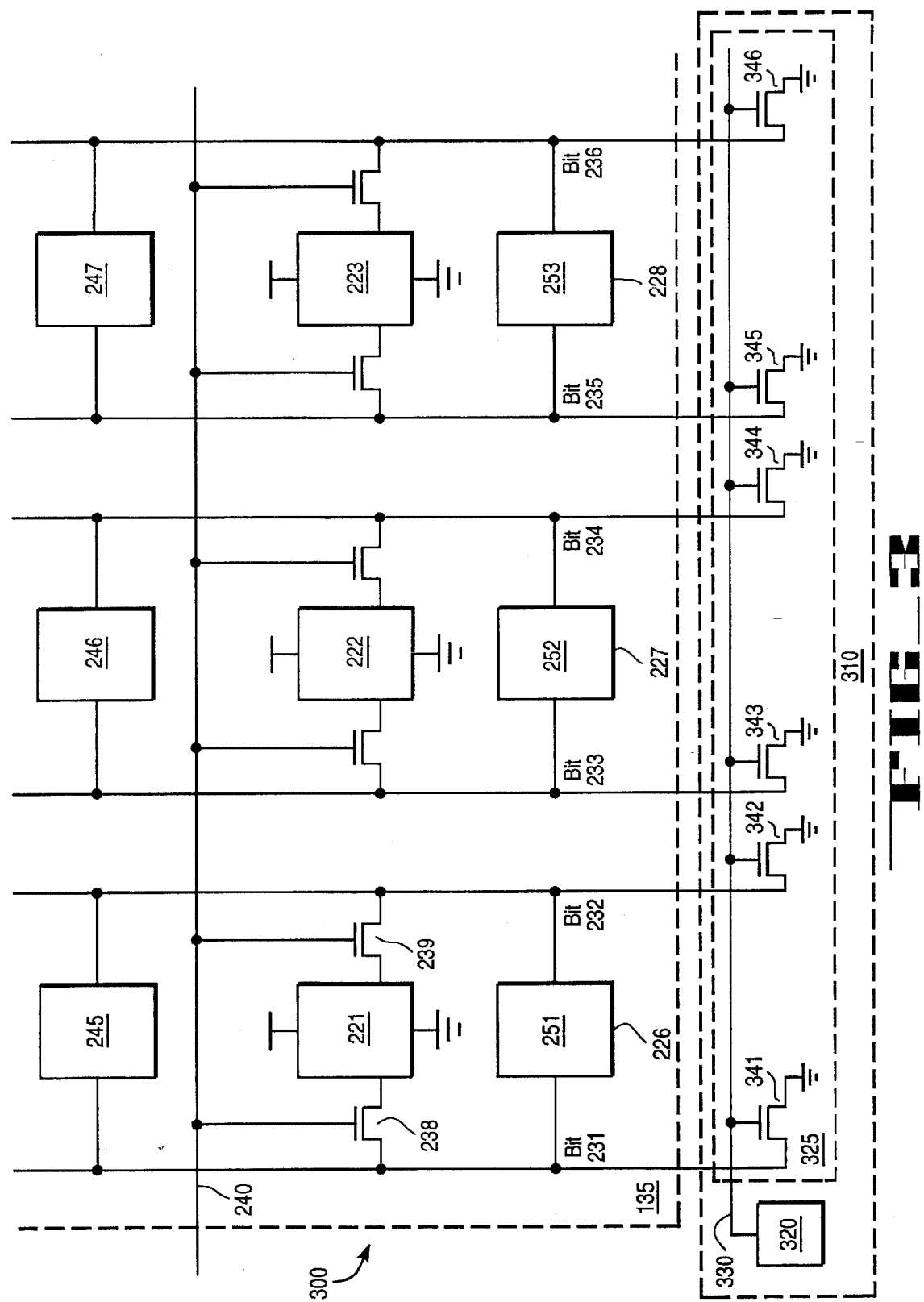

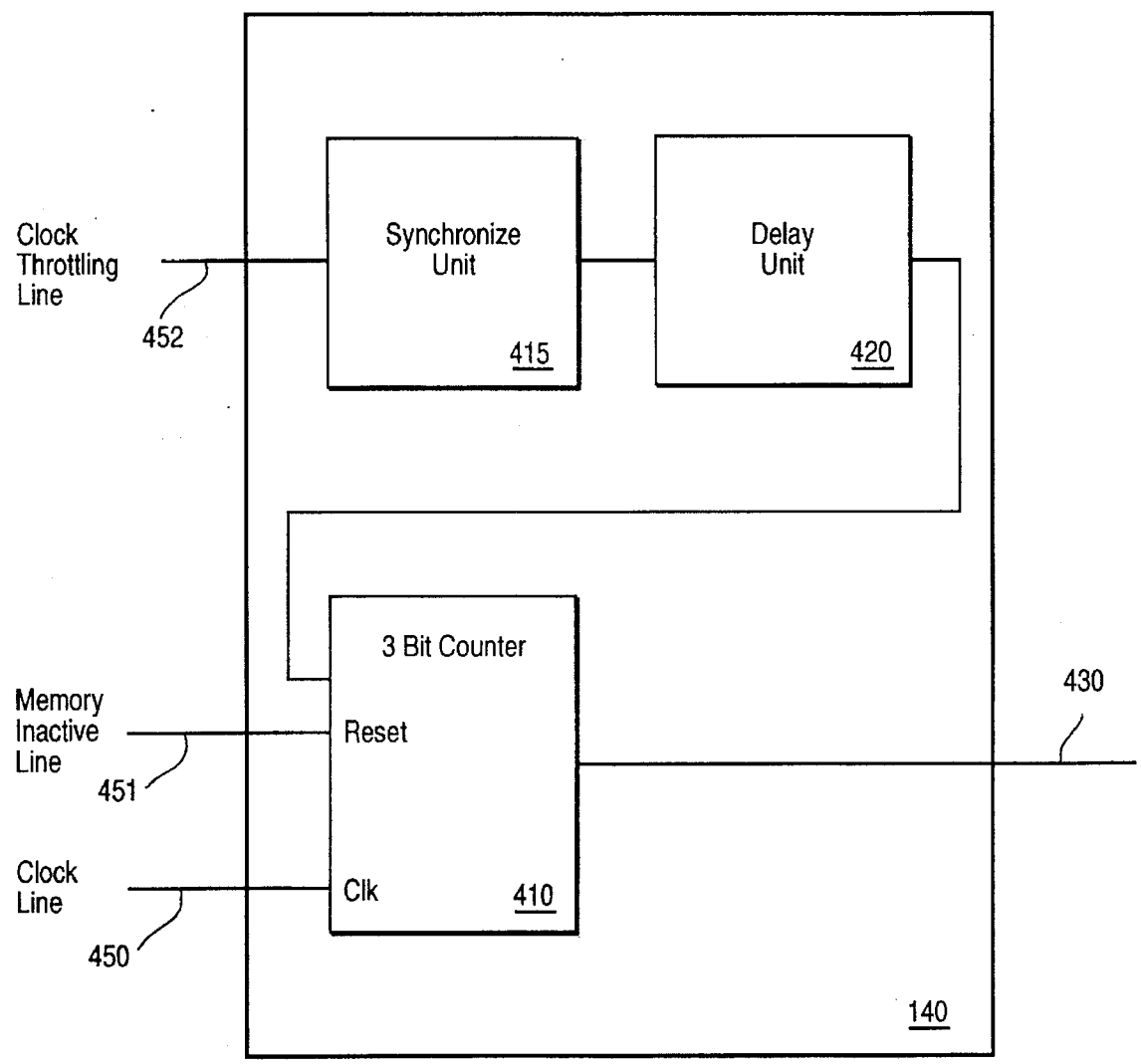
FIG_4

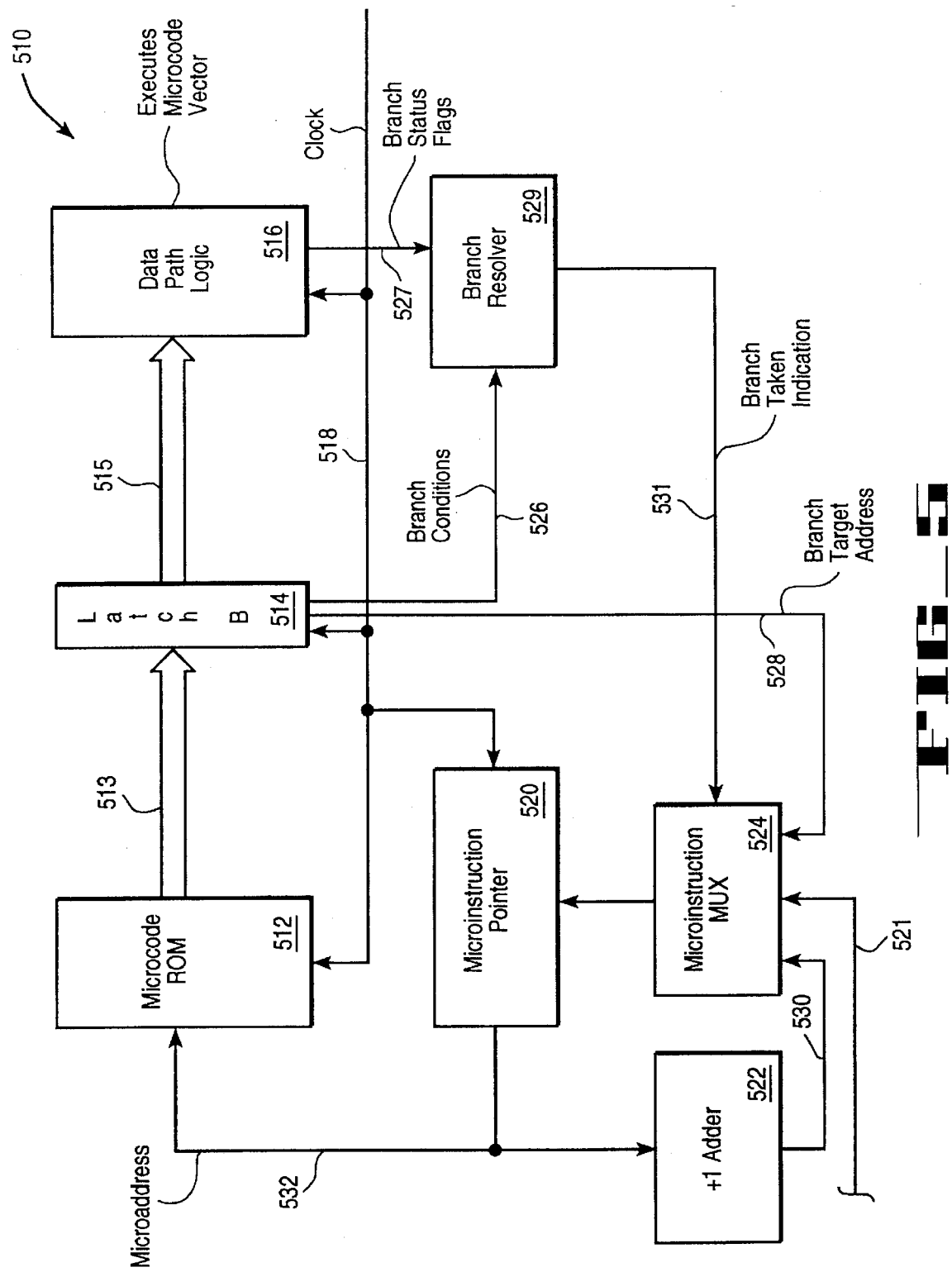
FIG_5

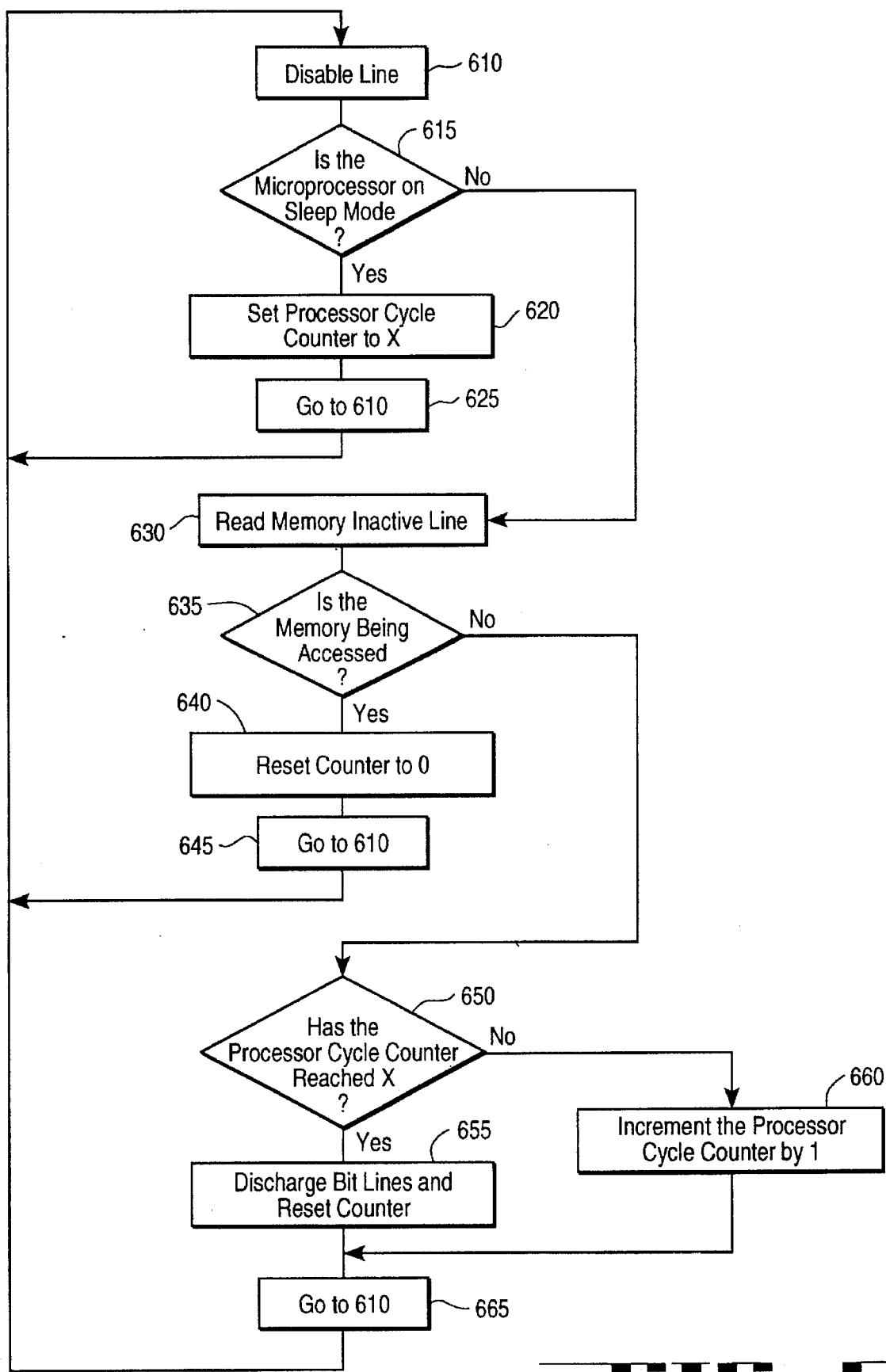
FIG_6

MEMORY UNIT WITH BIT LINE DISCHARGER

FIELD OF THE INVENTION

The present invention relates to the field of static memories in a computer system. More specifically, the present invention relates to an apparatus and method for discharging bit lines in memory.

BACKGROUND OF THE INVENTION

Static memories, whether implemented as stand alone memory units or used in a processor register file or cache, typically comprise an array of memory cells arranged in rows and columns. In one such memory unit, the CMOS SRAM comprises two conductors called bit lines. The contents of memory cells are read by applying an input voltage to a selected word line, or row, and sensing which bit line experiences a change in voltage. The bit lines act as capacitors and are typically precharged to a predetermined voltage prior to reading the memory location. The state assumed by a selected memory cell determines which bit line, the true bit line or the complement bit line, will be discharged toward ground when the cell is read.

Typical prior art memories use a sense amplifier coupled to the bit lines to sense the state of the selected bit lines. One type of sense amplifier is a differential sense amplifier that has the bit lines as its inputs. The sense amplifier amplifies the voltage difference between the true and complement bit lines. If the difference between the bit lines is a positive value, the sense amplifier indicates that the memory cell is programmed to a first logical state. If the difference between the bit line voltages is a negative value, the sense amplifier indicates that the memory cell is programmed to a second logical state. The sense amplifiers are designed to sense within a narrow active range.

With increased performance requirements of computer systems, memory units with enhanced performance are required.

Thus, what is needed is a memory unit with faster access time.

SUMMARY OF THE INVENTION

A memory unit is described. The memory unit includes a memory cell for storing a first or a second state. A bit line is coupled to the memory. The bit line discharges the voltage potential when the memory cell is read at the first state. A sensing unit coupled to the bit line reads the voltage level on the bit line. The sensing unit recognizes that if the voltage on the bit line is within a designated range, the memory cell is at the first state and if the voltage is outside the designated range, the memory cell is at the second state. A discharge unit coupled to the memory cell discharges voltage from the bit line to allow the memory unit to function more efficiently and reliably independent of memory idle time.

In one embodiment of the present invention, the discharge unit comprises a counter device for recording a number of processor cycles since the last memory access and circuitry coupled to the counter for executing a memory cell read after a predetermined number of processor cycles since the last access. In another embodiment of the present invention, the discharge unit is coupled to a mechanism used for stopping the internal processor clock. This clock throttling mechanism can be either STOP CLOCK, STOP GRANT or HALT conditions. The discharge unit executes a memory cell read after said clock throttling mechanism restores a first clock speed from a second clock speed. In one embodiment of the present invention, the second clock speed is zero.

In another embodiment of the present invention a method for managing a memory is disclosed. The method comprises charging a bit line in memory. After the bit line is charged, the number of processor cycles since a last memory access is determined. After a predetermined number of processor cycles have occurred, voltage is discharged from a bit line in memory. In another method according to an embodiment of the present invention, a bit line is charged in memory. After the bit line is charged, the time when the microprocessor is coming out of a low power mode, is determined. In one embodiment of the present invention, the internal processor clocks are stopped during low power mode. After the time is determined, voltage is discharged from a bit line in memory.

BRIEF DESCRIPTION OF THE DRAWINGS

The present invention will be understood more fully from the detailed description given below and the accompanied drawings of the various features and elements embodied in the invention. The description and drawings are not meant to limit the invention to the specific embodiment. They are provided for explanation and understanding.

FIG. 1 illustrates a computer system configured with one embodiment of the present invention.

FIG. 2 illustrates a memory device configured with one embodiment of the present invention.

FIG. 3 illustrates a memory device configured with a second embodiment of the present invention.

FIG. 4 is a block diagram illustrating one embodiment of the discharge unit.

FIG. 5 illustrates a micro-code sequencer according to one embodiment of the present invention.

FIG. 6 is a flow diagram illustrating one embodiment of a method according to the present invention.

DETAILED DESCRIPTION OF THE INVENTION

A method and apparatus for a memory unit is described. In the following description, numerous specific details are set forth to provide a thorough understanding of the present invention. However, it will be understood by those skilled in the art that the present invention may be practiced without these specific details. In other instances, well-known methods, procedures, components, and circuits have not been described in detail so as not to obscure the present invention.

FIG. 1 illustrates a computer system configured with one embodiment of the present invention. The computer system comprises a bus or other communication circuitry 101 for communicating information. A microprocessor 102 is used for processing information and is coupled onto bus 101. The computer system 100 further comprises main memory 103 coupled to bus 101. Main memory 103 is comprised of random access memory (RAM) or some other dynamic storage device which is used in storing information and instructions to be executed by microprocessor 102. Main memory 103 may also be used for storing temporary variables or other intermediate information during execution of instructions by microprocessor 102.

The computer system also comprises an external cache memory 104. External cache 104 provides storage space for holding frequently accessed instructions and data obtained from main memory 103 by microprocessor 102. By retrieving frequently accessed instructions and data from external cache 104, access time between the microprocessor 102 and main memory 103 is reduced. External cache 104 may be comprised of random access memory (RAM) and/or other static storage devices 104 coupled to bus 101 for storing information and instructions for microprocessor 102. A data storage device 105 such as a hard, floppy, or optical disk drive can be coupled to bus 101 for storing information and instructions. Also coupled to bus 101 are bus arbitrator 106 and interface/communications circuit 107. Bus arbitrator 106 is used to control the transmission and receipt of data on bus 101. Interface/communication circuit 107 is used to interface the computer system to another system, such as a computer network.

The computer system can be coupled to various devices. For example, a display device, 120, such as a cathode ray tube (CRT) can be coupled to bus 101 for displaying information to a computer user. An alphanumeric input device 121, including alphanumeric and other keys, may also be coupled to bus 101 for communicating information to the microprocessor 102. A cursor control 122 is coupled to bus 101 for communicating direction information and command selection to microprocessor 102, and for controlling cursor movement on display 120.

Microprocessor 102 comprises a memory unit 130. Memory unit 130 comprises a memory 135, a discharge unit 140, and a memory controller. Memory 135 may be an on-chip cache for holding frequently accessed instructions and data obtained from main memory 103 by microprocessor 102. Memory 135 comprises a device such as static random-access memory (SRAM) to store instructions and data. Discharge unit 140 is coupled to memory 135 and discharges voltage from bit lines in memory 135 to allow it to function more efficiently and reliably. FIG. 1 shows discharge unit 140 residing inside memory 135. In another embodiment of the present invention, discharge unit 140 resides in microprocessor 102, but outside memory unit 130. FIG. 1 shows memory unit 130 inside microprocessor 102. In other embodiments of the present invention, memory unit 130 can be outside microprocessor 102 and can be used as external cache memory. Discharge unit 140 can reside in the same component as memory 135 or can reside in a separate component.

FIG. 2 illustrates one embodiment of memory unit 130 according to the present invention. Memory unit 130 comprises memory 135, discharge unit 140, and read unit 210. Memory 130 comprises an array of memory cells 221, 222, and 223 arranged in rows and columns. Memory cells 221, 222, and 223 may be one of any various types of memory cells such as CMOS SRAM cells for example. Each memory cell can be programmed to either a first or second state. FIG. 2 illustrates one row 225 and three columns 226, 227, and 228 of memory cells. Each column comprises two bit lines, a true bit line and a complement bit line. Bit lines 231, 233, and 235 are true bit lines. Bit lines 232, 234, and 236 are complement bit lines. Column 226 comprises bit lines 231 and 232. Column 227 comprises bit lines 233 and 234. Column 228 comprises bit lines 235 and 236. The bit lines for each cell are driven to program the cell. For example, memory cell 221 can be programmed to a first state by driving bit line 231, the true bit line, high and driving bit line 232, the complement bit line, low, placing a value in cell 221.

The contents of each memory cells in array 130 are read by applying an input voltage to word line 240. The bit lines 231, 232, 233, 234, 235, and 236 act as capacitors and are precharged to a predetermined voltage prior to reading the memory location. Precharging units 245, 246, and 247 are coupled to their respective bit lines and precharges them to a voltage level near the supply voltage. In one embodiment of the present invention, precharging unit 245 comprises a transistor coupled to the supply voltage line. The state assumed by each memory cell determines which bit line, the true bit line or the complement bit line, will be discharged toward ground when an input voltage is applied to word line 240. The input voltage on word line 240 closes the gates of transistors 238 and 239 which connects memory cell 221 to the bit lines 231 and 232. Memory cell 221 in the first state causes bit line 231 to discharge toward ground. Memory cell 221 in the second state causes bit line 232 to discharge toward ground. Similarly, memory cells 222 and 223 will cause either their respective true bit line or complement bit line to be discharged toward ground, depending on which state the memory cells 222 and 223 are in.

Sense amplifiers 251, 252, and 253 are coupled to the bit lines 231, 232, 233, 234, 235, and 236. Sense amplifiers 251, 252, 253 amplifies the voltage difference between the true and complement bit lines after an input voltage is applied to word line 240. If the difference between the bit lines is a positive value, the sense amplifier detects that the memory cell is programmed at a first logical state. If the difference between the bit line voltages is negative value, the sense amplifier detects that the memory cell is programmed to a second logical state. Sense amplifiers 251, 252, and 253 may be one of various designs. In one embodiment of the present invention, sense amplifiers 251, 252, and 253 are operational amplifiers. Sense amplifiers 251, 252, and 253 typically require a period of time to process the voltage inputs from the bit lines 231, 232, 233, 234, 235, and 236 and are designed to sense within a narrow active range. If the voltages on the bit lines are not within the optimum range of the sense amplifiers 251, 252, and 253, the sense amplifiers 251, 252, and 253 will take a longer period of time to process the voltage inputs.

Bit lines 231, 232, 233, 234, 235, and 236 are read whenever an input voltage is applied at word line 240. Word line 240 is coupled to read unit 210 and discharge unit 140 through an ORing mechanism 255. Whenever read unit 210 or discharge unit 140 sends a signal, word line 240 applies a voltage to the transistor on each bit line. Read unit 210 is a device in memory unit 130 which directs the memory unit 130 to perform an access of memory 135. Read unit 210 executes memory reads during typical operations of the memory unit. Memory reads are executed, for example, when microprocessor 102 or a peripheral wishes to access a piece of data.

Discharge unit 140 discharges bit lines 231, 232, 233, 234, 235, and 236. In order to speed up the time of memory reads, memory designers often elect to discharge bit lines instead of charge bit lines during memory reads. This typically requires the bit lines to be precharged to a voltage level close to the supply voltage during periods of inactivity. The precharge voltage on the bit lines is determined by the duration of the precharge. Thus, if the memory is inactive for a long period of time, the bit lines are precharged to a higher voltage level. As a results the sense amplifiers require a longer period of time to process the voltage inputs, causing the microprocessor to fail at the operating frequency.

Discharge unit 140 prevents bit lines 231, 232, 233, 234, 235, and 236 from becoming overcharged. Discharge unit 140 asserts a voltage signal on line 240 to discharge the bit lines during periods of memory inactivity so that the bit lines do not become charged to a level that would require sense amplifiers 251, 252, and 253 to cause delays during memory reads.

Discharge unit 140 also asserts a voltage signal on line 240 whenever a mechanism used for stopping the internal processor clock is deasserted. This causes a dummy read to be executed immediately after the microprocessor comes out of a low power mode. The clock throttling mechanism can be a STOP CLOCK, STOP GRANT or a HALT condition which stops the internal processor clock when asserted. Discharging bit lines in a memory after a microprocessor is awaken from a low power mode is important. Power management tools which periodically shut down the microprocessor clock typically generate a sudden increase in current draw to power the microprocessor when it awakens. The dramatic change in current over time causes the supply voltage to dip. As a result of the drop in the supply voltage, the optimum range in which sense amplifiers 251, 252, and 253 operate also reduces as it tracks the supply voltage. This causes subsequent memory reads to require extra processing time by the sense amplifiers 251, 252, and 253 because the bit lines are overcharged. By discharging the bit line voltages, discharge unit 140 allows the bit line voltage to track the supply voltage, allowing the sense amplifiers 251, 252, and 253 to operate at their optimum voltage range. Also, if sufficient time is not allowed, the product will fail.

Discharge unit 140 mitigates the problems associated with overcharged bit lines. By discharging overcharged bit lines, the risk of encountering an incorrect memory read due to an increased processing time requirement from the sense amplifiers is reduced. By discharging overcharged bit lines, designation of longer memory read cycles to account for increased processing time requirements of the sense amplifier is not necessary. This is especially beneficial since longer memory read cycles translates to a slower operating frequency of the computer system. Also, if sufficient time is not allowed, the product will fail.

In another embodiment of the present invention, discharge unit 140 discharges bit lines 231, 232, 233, 234, 235 and 236 whenever a cache snoop is performed. During invalidation, when only the tags of a cache are accessed, bit lines 231, 232, 233, 234, 235, and 236 can be overcharged, leading to the problems discussed above. In this embodiment of the present invention, the bit lines are discharged whenever a cache snoop is performed to prevent overcharging.

FIG. 2 illustrates read unit 210 and discharge unit 140 are coupled in parallel to word line 240. In another embodiment of the present invention, discharge unit 140 and read unit 210 are coupled in series with word line 240. Thus, when discharge unit 140 asserts a voltage signal, read unit 210 executes a dummy memory read which discharges overcharged bit lines. Dummy memory reads are similar to normal memory reads, except that the data read is unused.

FIG. 3 illustrates a memory device configured with another embodiment of the present invention. Memory device 300 comprises memory 135 and discharge unit 310. Discharge unit 310 comprises discharge logic circuit 320 and bit line discharging circuitry 325. Discharge logic circuit 320 comprises logic which causes it to assert a voltage signal after a period of memory inactivity or when a clock throttling mechanism in the microprocessor is deasserted. In one embodiment of the present invention discharge logic circuit 320 comprises circuitry similar to that of discharge unit 140 in FIG. 2. Discharge logic circuit 320 is coupled to bit line discharging circuitry 325 which discharges bit lines 231, 232, 233, 234, 235, and 236 when a voltage signal is asserted on line 330. In one embodiment of the present invention, bit line discharging circuitry 325 comprises a plurality of transistors coupling bit lines 231, 232, 233, 234, 235, and 236 to ground. When discharge logic circuit 320 asserts a voltage signal on line 330, transistors 341, 342, 343, 344, 345, and 346 connect bit lines 231, 232, 233, 234, 235, and 236 causing them to discharge. The discharging is achieved independent of word line 240.

FIG. 4 illustrates a block diagram of one embodiment of a discharge unit 140. Discharge unit 140 comprises counter device 410, synchronizer unit 415, and delay unit 420. Discharge unit 140 receives signals from a clock line 450, a memory access detector line 451, and a clock throttling line 452. In one embodiment of the present invention, clock line 450 is coupled to a processor clock. In other embodiments of the present invention, clock line 450 could be coupled to other clocks in the computer system. Memory detector line 451 is coupled to a memory detector unit which generates a signal when memory unit 130 is idle. Clock throttling line 452 is coupled to a clock throttling mechanism which shuts off the processor clock. Clock throttling mechanism may be a mechanism which asserts and de-asserts an internal clock divider mechanism in the microprocessor 102 which throttles the internal microprocessor clock. For example, the mechanism can be one which disengages the phase lock loop in the microprocessor, such as a STOP CLOCK signal, or one which disengages the output of the PLL to control units in the microprocessor, such as a STOP GRANT signal.

Counter device 410 receives signals from clock line 450 and memory access detector line 451. Counter device 410 records the number of clock cycles that transpired since the last access from memory unit 130. If the number of clock cycles recorded in counter device 410 reaches a predetermined number, counter device asserts a voltage signal on line 430 and resets itself. In one embodiment of the present invention, this number is eight clock cycles.

Synchronizer unit 415 receives a signal from clock throttling line 452. Synchronizer unit 415 synchronizes signals received from clock throttling line 452 with the clock signals on line 450. After the signal is synchronized it is sent to delay unit 420 before being sent to counter device 410. Delay unit 420 asserts an appropriate delay on the signal from clock throttling 452, allowing the signal to be received by counter device 410 at an appropriate time. The delayed clock throttling signal sets counter device 410 to the predetermined number which causes it to assert a voltage signal on line 430. The delayed clock throttling signal also shuts off the counter device 410 so that bit lines are not discharged when the microprocessor is shut down. When the clock throttling signal on line 452 is deasserted, counter device is at the predetermined number causing it to asserts a voltage on line 430. This discharges the bit lines before a real memory read is performed.

FIG. 5 illustrates a micro-code sequencer 500 in microprocessor 102. Micro-code sequencer 500 includes a micro-code ROM 512 for storing individual micro-code vectors, each having a unique micro-address. During use, individual micro-code vectors are output from micro-code ROM 512 along path 513 to a latch 514. The micro-code vectors are then output to a data path logic unit 516 along a path 515. Data path logic unit 516 executes the micro-code vectors received from latch 514. Output, latching, and execution of the micro-code vectors are synchronized by a clock signal provided on a clock line 518. The micro-code vectors output from micro-code ROM 512 are identified by micro-instruction pointer 520. In this embodiment of the present invention, the micro-code vectors corresponding to a single instruction are stored in sequence in micro-code ROM 512. The starting micro-address is supplied to micro-instruction pointer 520 along a line 521 from an instruction decoder via a multiplexer 524. An adder 522 is connected to micro-instruction pointer 520 through multiplexer 524 for incrementing the micro-address stored within micro-instruction pointer 520.

In one embodiment of the present invention, micro-code ROM 512 contains a set of micro-code instructions for discharging bit lines 231, 232, 233, 234, 235, and 236 in memory 135 after a predetermined number of clock cycles after a last memory access. In another embodiment of the present invention, micro-code ROM 512 contains a set of micro-code instructions for discharging bit lines 231, 232, 233, 234, 235, and 236 in memory 135 in response to a deassertion of a clock throttling signal. In another embodiment of the present invention, micro-code ROM 512 contains a set of micro-code instructions for discharging bit lines 231, 232, 233, 234, 235, and 236 in memory 135 in response to a power up signal.

FIG. 6 is a flow diagram illustrating a method of managing a memory according to one embodiment of the present invention. First, read a clock disable line. The clock disable line is active whenever the processor clock is disabled. The processor clock can be disabled when the STOP CLOCK, STOP GRANT or HALT condition is asserted. This is shown in block 610. Next, use the clock disable line to determine whether the microprocessor is in sleep mode, as shown in block 615. If the microprocessor is in sleep mode, set the processor cycle counter to the value X, where X is a predetermined number of processor cycles. Next, the routine is required to go to block 610 as shown in block 625. If the microprocessor is not in sleep mode, go to block 630. Block 630 requires the memory inactive line to be read. Next, use the memory inactive line to determine whether memory is being accessed, as illustrated in block 635. If memory is being accessed reset the processor cycle counter to zero. This is shown in block 640. If memory is not being accessed go to block 650. Block 645 requires the routine to go to block 610.

Block 650 requires the routine to determine whether the processor cycle counter has reached the predetermined value X. If the predetermined value has been reached, discharge selected bit lines in memory and reset processor cycle counter, as shown in block 655. If the predetermined value has not been reached, go to block 660. Block 660 increments the processor cycle counter by 1. Block 665 directs the routine to return to block 610. In the foregoing description, the invention is described with reference to specific exemplary embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

Thus, an apparatus and method for managing a memory in a computer system is disclosed. The apparatus and method allows the memory to function efficiently and reliably without requiring a longer memory access cycle to insure accurate memory reads.

What is claimed is:

1. A memory unit comprising:

a memory cell having either a first or a second state;

a bit line coupled to said memory cell;

a sensing unit coupled to said bit line that detects said first or said second state; and a discharging unit coupled to said memory cell that discharges said bit line, said discharging unit including a counter that counts a number of processor cycles following a last access, and circuitry coupled to said counter that executes a memory read a predetermined number of processor cycles after said last access.

2. The memory unit of claim 1 wherein said discharging unit is coupled to a clock throttling mechanism and discharges said bit line after said clock throttling mechanism restores a first clock speed from a second clock speed.

3. The memory unit of claim 2 wherein said discharging unit discharges said bit line by executing a memory read.

4. The memory unit of claim 1 wherein said discharging unit discharges said bit line in response to a power up signal.

5. The memory unit of claim 1 wherein said discharging unit discharges said bit line in response to a deassertion of a STOP CLOCK condition.

6. The memory unit of claim 1 wherein said discharging unit resides in a microprocessor.

7. The memory unit of claim 1 wherein said discharging unit resides in a cache external to a microprocessor.

8. The memory unit of claim 1 wherein said discharging unit further includes:

a processor coupled to said memory cell;

a set of microcode instructions that discharge said bit line in response to a power up signal.

9. A method for managing a memory in a computer system comprising the steps of:

suppressing a clock signal to a portion of a microprocessor operating in a low power mode;

charging a bit line in said memory;

awakening said microprocessor from said low power mode upon receiving a power-up signal;

restoring said clock signal to said portion of said microprocessor; and discharging voltage from said bit line in said memory after restoring said clock signal to said portion of said microprocessor.

10. The method of claim 9 wherein said discharging step comprises the step of:

executing a read cycle to said memory by said microprocessor.

11. The method of claim 9 wherein said discharging step is performed prior to the additional step of:

accessing said memory by said microprocessor.

* * * * *